(12) United States Patent
Jeon et al.

(10) Patent No.: US 7,240,257 B2
(45) Date of Patent: Jul. 3, 2007

(54) MEMORY TEST CIRCUIT AND TEST SYSTEM

(75) Inventors: Soon-keun Jeon, Suwon-si (KR); Yong-cheul Kim, Seoul (KR); Han Kim, Osan-si (KR); Bae-sun Jun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 59 days.

(21) Appl. No.: 10/994,140

(22) Filed: Nov. 19, 2004

(65) Prior Publication Data

US 2005/0117420 A1    Jun. 2, 2005

(30) Foreign Application Priority Data

Nov. 27, 2003  (KR)  .................. 10-2003-0084957

(51) Int. Cl.
   *G11C 29/00*   (2006.01)
(52) U.S. Cl. .................. 714/723; 714/30; 714/719; 714/733; 365/201
(58) Field of Classification Search .............. None
   See application file for complete search history.

(56) References Cited

U.S. PATENT DOCUMENTS

| | | | | |
|---|---|---|---|---|
| 5,910,921 A * | 6/1999 | Beffa et al. .................. 365/201 |
| 5,912,901 A | 6/1999 | Adams et al. .............. 371/22.5 |
| 5,987,632 A | 11/1999 | Irrinki et al. ................ 714/711 |
| 6,085,346 A * | 7/2000 | Lepejian et al. ............ 714/733 |
| 6,108,252 A * | 8/2000 | Park .......................... 365/201 |
| 6,163,863 A * | 12/2000 | Schicht ....................... 714/718 |
| 6,310,807 B1 | 10/2001 | Ooishi et al. ................ 365/200 |
| 6,408,401 B1 * | 6/2002 | Bhavsar et al. ................. 714/7 |
| 6,421,794 B1 * | 7/2002 | Chen et al. .................... 714/42 |
| 6,574,763 B1 * | 6/2003 | Bertin et al. ................. 714/738 |
| 6,937,531 B2 * | 8/2005 | Frankowsky ................ 365/200 |
| 7,013,413 B1 * | 3/2006 | Kim et al. ................... 714/719 |
| 2003/0014702 A1 * | 1/2003 | Finteis ....................... 714/718 |
| 2003/0177415 A1 * | 9/2003 | Togashi et al. ............... 714/30 |
| 2005/0030822 A1 * | 2/2005 | Beer .......................... 365/232 |

FOREIGN PATENT DOCUMENTS

| | | |
|---|---|---|
| JP | 2000-011691 | 1/2000 |
| JP | 2002-117697 | 4/2002 |
| KR | 01-27673 | 4/2001 |

* cited by examiner

*Primary Examiner*—Guy Lamarre
*Assistant Examiner*—John P. Trimmings
(74) *Attorney, Agent, or Firm*—Mills & Onello, LLP

(57) ABSTRACT

A memory test circuit comprises a memory which outputs stored data through n-bit data output pins, and a built-in self test (BIST) unit. The BIST unit writes test data in the memory, and by comparing the test data output from the memory with expected data, determines a failure cell address in the memory. The BIST unit generates k preliminary failure signals having failure information indicating whether the test data correspond with the expected data, and outputs the k preliminary failure signals for m cycles of a clock signal, by outputting k/m preliminary failure signals each cycle as first through k/m failure signals. In the memory test circuit and test system, the BIST unit testing a memory and generating a failure signal is disposed in a memory apparatus and a failure analysis circuit analyzing a failure signal output by the BIST unit is disposed in the test apparatus.

26 Claims, 7 Drawing Sheets

MEMORY TEST CIRCUIT AND TEST SYSTEM

BACKGROUND OF THE INVENTION

This application claims the priority of Korean Patent Application No. 2003-84957, filed on Nov. 27, 2003, in the Korean Intellectual Property Office, the contents of which are incorporated herein in their entirety by reference.

1. Field of the Invention

The present invention relates to a memory test circuit and a test system, and more particularly, to a test circuit and a test system having a built-in self test (BIST) unit for testing failure a highly integrated memory.

2. Description of the Related Art

Today, chips are designed and manufactured for deep sub-micron (DSM) technology, and more memories are embedded such that memory yield has a serious effect on the yield of the entire chip. Accordingly, in order to improve the yield of chips, a repairable memory is needed.

In addition, as the degree of integration of a semiconductor device increases and the functions become more complicated, a variety of methods for efficiently testing such semiconductor devices are being developed. In particular, in order to efficiently test a memory embedded in a semiconductor device, a method referred to as a memory BIST (hereinafter referred to as 'BIST'), has been developed. By using a circuit implementing a memory test algorithm, an embedded memory is tested according to this method.

More recently, unlike the BIST testing a memory, built-in redundancy analysis (BIRA) technology, by which, after testing an embedded repairable memory by using the BIST test method, a failure is analyzed and information to performing repair is extracted, has been introduced.

That is, by using the BIST, a memory is tested and information on a failure is stored, and then according to built-in self repair (BISR), repair is performed and by using a scan chain the result is output.

However, when the BIST is used to repair a highly integrated memory capable of repairing a row and column failure in order to improve yield, the overhead of the BIST increases such that design of the BIST becomes difficult.

SUMMARY OF THE INVENTION

The present invention provides a memory test circuit which, whenever a failure occurs in a memory, outputs a failure signal synchronized with a clock signal.

The present invention also provides a test system which, whenever a failure occurs in a memory, generates a failure signal synchronized with a clock signal and by analyzing the failure signal, performs repair of the failure of the memory.

According to an aspect of the present invention, there is provided a memory test circuit comprising a memory which outputs stored data through n-bit data output pins, and a built-in self test (BIST) unit. The BIST unit writes test data in the memory, and by comparing the test data output from the memory with expected data, determines a failure cell address in the memory. The BIST unit generates k preliminary failure signals having failure information indicating whether the test data correspond with the expected data, and outputs the k preliminary failure signals for m cycles of a clock signal, by outputting k/m preliminary failure signals each cycle as first through k/m failure signals.

In one embodiment, when a test operation is performed, the memory divides the n-bit data output pins into eight groups to make the groups correspond to respective areas in the memory, and when a repair operation is performed, repair is performed in each area of the memory corresponding to the eight groups of the data output pins.

In one embodiment, the memory is a high capacity single port synchronous random access memory (HCSPSRAM).

In one embodiment, the BIST unit comprises an expected data generation unit, a comparison unit, and a failure signal generation unit. The expected data generation unit generates the expected data. The comparison unit receives first through k-th test data that are obtained by dividing the n-bit test data output from the memory, from the least significant bit to the most significant bit, into k groups, and receives the expected data, and then generates first through k-th preliminary failure signals having failure information. The failure signal generation unit outputs the first through k-th preliminary failure signals for m cycles of a clock signal by outputting k/m preliminary failure signals for each cycle as first through k/m-th failure signals.

In one embodiment, the comparison unit comprises first through k-th comparators which compare the first through k-th test data with expected data and output the first through k-th preliminary failure signals, respectively.

In one embodiment of the memory test circuit, m is 2 and the failure signal generation unit outputs the first through k/2-th preliminary failure signals as the first through k/2-th failure signals during the first cycle of the clock signal, and during the second cycle of the clock signal, outputs the (k/2+1)-th through k-th preliminary failure signals as the first through k/2-th failure signals.

In one embodiment, the failure signal generation unit comprises first through fourth preliminary flip-flops, first through fourth AND units, and first through fourth flip-flops. The first through fourth preliminary flip-flops store the (k/2+1)-th through k-th preliminary failure signals, respectively, synchronized with the clock signal. The first through fourth AND units perform AND operations for the first through k/2-th preliminary failure signals with the outputs of the corresponding first through fourth preliminary flip-flops, respectively. The first through fourth flip-flops, in response to the clock signal, store the outputs of the first through fourth AND units and then output the stored outputs of the first through fourth AND units as the first through k/2-th failure signals, respectively.

In one embodiment of the memory test circuit, m is 4 and the failure signal generation unit outputs the first through k/4 preliminary failure signals as the first through k/4 failure signals during the first cycle of the clock signal, outputs the (k/4+1)-th through k/2-th preliminary failure signals as the first through k/4 failure signals during the second cycle of the clock signal, outputs the (k/2+1)-th through 3k/4-th preliminary failure signals as the first through k/4 failure signals during the third cycle of the clock signal, and outputs the (3k/4+1)-th through k-th preliminary failure signals as the first through k/4 failure signals during the fourth cycle of the clock signal.

In one embodiment, the failure signal generation unit comprises first and second preliminary flip-flops, first and second AND units, third and fourth preliminary flip-flops, third and fourth AND units, fifth and sixth preliminary flip-flops, fifth and sixth AND units, and first and second flip-flops. The first and second preliminary flip-flops store the (3k/4+1) through k-th preliminary failure signals synchronized with the clock signal. The first and second AND units perform AND operations for the (k/2+1)-th through 3k/4-th preliminary failure signals with the outputs of the corresponding first and second preliminary flip-flops, respectively, and output the results. The third and fourth preliminary flip-flops in response to the clock signal store the outputs of the first and second AND units, respectively. The third and fourth AND units perform AND operations for the (k/4+1)-th through k/2-th preliminary failure signals with the outputs of the corresponding third and fourth preliminary flip-flops, respectively, and output the results. The fifth and sixth preliminary flip-flops in response to the clock signal store the outputs of the third and fourth AND units, respectively. The fifth and sixth AND units perform AND operations for the first through k/4-th preliminary failure signals with the outputs of the corresponding fifth and sixth preliminary flip-flops, respectively, and output the results. The first and second flip-flops in response to the clock signals store the outputs of the fifth and sixth AND units, respectively, and then output the stored outputs of the fifth and sixth AND units as the first through k/4-th failure signals, respectively.

In one embodiment of the memory test circuit, when n is 16 and k is 8, the first preliminary failure signal indicates information on a failure cell address in a memory area corresponding to first and second data output pins of the memory, and the second preliminary failure signal indicates information on a failure cell address in a memory area corresponding to third and fourth data output pins of the memory. The third preliminary failure signal indicates information on a failure cell address in a memory area corresponding to fifth and sixth data output pins of the memory, and the fourth preliminary failure signal indicates information on a failure cell address in a memory area corresponding to seventh and eighth data output pins of the memory. The fifth preliminary failure signal indicates information on a failure cell address in a memory area corresponding to ninth and tenth data output pins of the memory, and the sixth preliminary failure signal indicates information on a failure cell address in a memory area corresponding to eleventh and twelfth data output pins of the memory. The seventh preliminary failure signal indicates information on a failure cell address in a memory area corresponding to thirteenth and fourteenth data output pins of the memory, and the eighth preliminary failure signal indicates information on a failure cell address in a memory area corresponding to fifteenth and sixteenth data output pins of the memory.

According to another aspect of the present invention, there is provided a failure analysis circuit comprising a counter, a buffer unit, and a controller. The counter counts the number of clocks of a clock signal and, if a control signal is activated, outputs the number of clocks of the clock signal counted until that time. The buffer unit receives and stores first through q-th failure signals indicating whether or not there is a failure cell in a memory, and outputs the first through q-th failure signals synchronized with the clock signal. The controller receives the first through q-th failure signals output from the buffer unit and, if a failure is recognized, activates the control signal. The failure analysis circuit analyzes a memory address to be repaired using the number of clocks output from the counter and the first through q-th failure signals.

In one embodiment, the memory has n-bit data output pins, and when a test operation is performed, divides the n-bit data output pins into eight groups to make the groups correspond to respective areas in the memory, and when a repair operation is performed, repair is performed in each area of the memory corresponding to the eight groups of the data output pins.

In one embodiment, the memory is a high capacity single port synchronous random access memory (HCSPSRAM).

In one embodiment, in the failure analysis circuit, as the first through q-th failure signals, q preliminary failure signals of first through eighth preliminary failure signals are output during every 8/q cycles of the clock signals, and each of the first through eighth preliminary failure signals indicates information on a failure cell address of the corresponding memory area when n-bit data output pins of the memory are divided into 8 groups.

According to still another aspect of the present invention, there is provided a test system comprising a memory test circuit and a failure analysis circuit. The memory test circuit outputs k preliminary failure signals having failure cell address information of a memory, by outputting k/m preliminary failure signals as first through k/m-th failure signals for m cycles of a clock signal. The failure analysis circuit, using the first through k/m-th failure signals and the number of clocks of the clock signal, analyzes a memory address to be repaired.

In one embodiment, the memory test circuit comprises a memory which outputs stored data through n-bit data output pins, and a BIST unit. The BIST unit writes test data in the memory, and by comparing the test data output from the memory with expected data, determines a failure cell address in the memory. The BIST unit generates k preliminary failure signals having failure information indicating whether the test data correspond with the expected data, and outputs the k preliminary failure signals for m cycles of a clock signal, by outputting k/m preliminary failure signals each cycle as first through k/m failure signals. In one embodiment, when a test operation is performed, the memory divides the n-bit data output pins into eight groups to make the groups correspond to respective areas in the memory, and when a repair operation is performed, repair is performed in each area of the memory corresponding to the eight groups of the data output pins.

In one embodiment, the memory is a high capacity single port synchronous random access memory (HCSPSRAM).

In one embodiment, the BIST unit comprises: an expected data generation unit which generates the expected data; a comparison unit which receives first through k-th test data that are obtained by dividing the n-bit test data output from the memory, from the least significant bit to the most significant bit, into k groups, and receives the expected data, and then generates first through k-th preliminary failure signals having failure information; and a failure signal generation unit which outputs the first through k-th preliminary failure signals for m cycles of a clock signal by outputting k/m preliminary failure signals for each cycle as first through k/m-th failure signals. In one embodiment, the comparison unit comprises: first through k-th comparators which compare the first through k-th test data with expected data and outputs the first through k-th preliminary failure signals, respectively. In one embodiment, m is 2 and the failure signal generation unit outputs the first through k/2-th preliminary failure signals as the first through k/2-th failure signals during the first cycle of the clock signal, and during the second cycle of the clock signal, outputs the (k/2+1)-th through k-th preliminary failure signals as the first through k/2-th failure signals.

In one embodiment, the failure signal generation unit comprises: first through fourth preliminary flip-flops which store the (k/2+1)-th through k-th preliminary failure signals, respectively, synchronized with the clock signal; first through fourth AND units which perform AND operations for the first through k/2-th preliminary failure signals with the outputs of the corresponding first through fourth preliminary flip-flops, respectively; and first through fourth flip-flops which in response to the clock signal, store the outputs of the first through fourth AND units and then output the stored outputs of the first through fourth AND units as the first through k/2-th failure signals, respectively.

In one embodiment, m is 4 and the failure signal generation unit outputs the first through k/4 preliminary failure signals as the first through k/4 failure signals during the first cycle of the clock signal, outputs the (k/4+1)-th through k/2-th preliminary failure signals as the first through k/4 failure signals during the second cycle of the clock signal, outputs the (k/2+1)-th through 3k/4-th preliminary failure signals as the first through k/4 failure signals during the third cycle of the clock signal, and outputs the (3k/4+1)-th through k-th preliminary failure signals as the first through k/4 failure signals during the fourth cycle of the clock signal. In one embodiment, the failure signal generation unit comprises: first and second preliminary flip-flops which store the (3k/4+1) through k-th preliminary failure signals synchronized with the clock signal; first and second AND units which perform AND operations for the (k/2+1)-th through 3k/4-th preliminary failure signals with the outputs of the corresponding first and second preliminary flip-flops, respectively, and output the results; third and fourth preliminary flip-flops which in response to the clock signal store the outputs of the first and second AND units, respectively; third and fourth AND units which perform AND operations for the (k/4+1)-th through k/2-th preliminary failure signals with the outputs of the corresponding third and fourth preliminary flip-flops, respectively, and output the results; fifth and sixth preliminary flip-flops which in response to the clock signal store the outputs of the third and fourth AND units, respectively; fifth and sixth AND units which perform AND operations for the first through k/4-th preliminary failure signals with the outputs of the corresponding fifth and sixth preliminary flip-flops, respectively, and output the results; and first and second flip-flops which in response to the clock signals store the outputs of the fifth and sixth AND units, respectively, and then output the stored outputs of the fifth and sixth AND units as the first through k/4-th failure signals, respectively.

In one embodiment, the failure analysis circuit comprises a counter, a buffer unit and a controller. The counter counts the number of clocks of a clock signal and, if a control signal is activated, outputs the number of clocks of the clock signal counted until that time. The buffer unit receives and stores first through k/m-th failure signals indicating whether or not there is a failure cell in a memory, and outputs the first through k/m-th failure signals synchronized with the clock signal. The controller receives the first through k/m-th failure signals output from the buffer unit and, if a failure is recognized, activates the control signal, wherein the failure analysis circuit analyzes a memory address to be repaired using the number of clocks output from the counter and the first through k/m-th failure signals.

In one embodiment, as the first through k/m-th failure signals, k/m preliminary failure signals of first through eighth preliminary failure signals are output during every m cycles of the clock signals, and each of the first through eighth preliminary failure signals indicates information on a failure cell address of the corresponding memory area when n-bit data output pins of the memory are divided into 8 groups.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DESCRIPTION OF THE PREFERRED EMBODIMENTS

Figure 1:
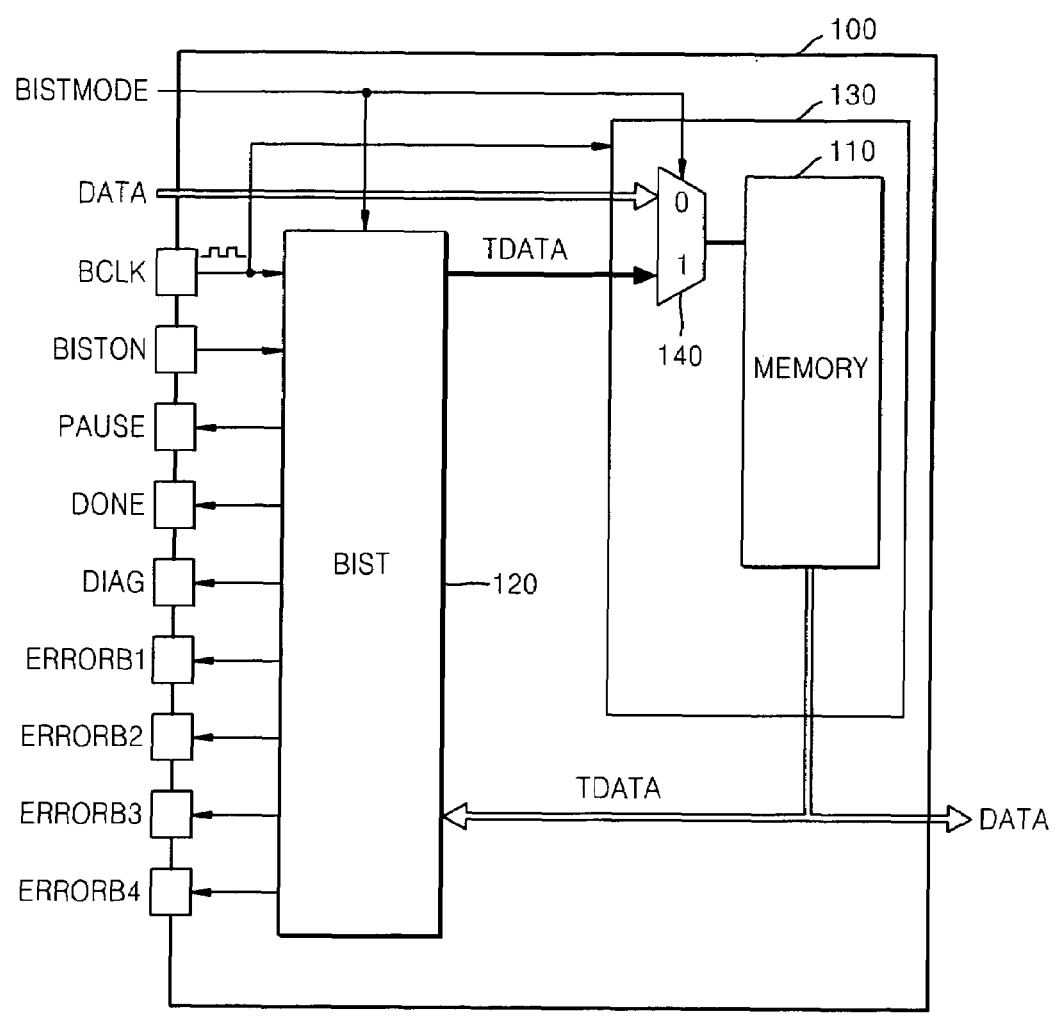
FIG. 1 is a schematic diagram of a memory test circuit according to a preferred embodiment of the present invention.

Referring to FIG. 1, a memory test circuit 100 comprises a memory 110, which outputs stored data (DATA) through n-bit data output pins (not shown), and a BIST unit 120.

The BIST unit 120 writes test data (TDATA) in the memory 110, and by comparing test data (TDATA) output from the memory 110 with expected data (not shown), determines a failure cell address in the memory 110.

When performing a test operation, the memory divides the n-bit data output pins (not shown) into 8 groups so that the groups correspond to respective areas of the internal memory 110, and when repairing a failure memory cell, performs repairing operations in respective memory areas corresponding to the 8-group data output pins.

The memory 110 is a high capacity single port synchronous random access memory (HCSPSRAM).

The HCSPSRAM comprises row redundancy and column redundancy. If a failure address occurs in an ordinary memory, all data bits corresponding to the failure address are repaired.

However, data bits of the HCSPSRAM are divided into 8 groups and if a failure address occurs, data bits of one group corresponding to the failure address among 8 groups are repaired.

For example, if the memory 110 of FIG. 1 has 16-bit data output pins, the memory 110 is divided into 8 memory areas each having 2-bit data output pins. If a failure address occurs, repairing is performed in only one group corresponding to the failure address.

A test logic 130 surrounding the memory 110 comprises an isolation logic and selection unit 140. When the memory test circuit 100 is not in test mode but is in normal operation mode, a BIST-on signal (BISTON) turns off the BIST unit 120.

Then, in response to a BIST mode signal (BISTMODE), the selection unit 140 selects data (DATA) instead of test data (TDATA), and sends the selected data to the memory 110.

When the memory test circuit 100 is in test mode, the BIST unit 120 is turned on by the BIST-on signal (BISTON) and writes test data (TDATA) in the memory 110. Then, by comparing test data (TDATA) output from the memory 110 with expected data (not shown), the BIST unit 120 determines a failure cell address in the memory 110.

The BIST unit 120 generates k preliminary failure signals (not shown) having failure information indicating whether test data (TDATA) corresponds with expected data (not shown), and outputs the k preliminary failure signals (not shown) for m cycles of a clock signal (BCLK) by outputting k/m preliminary failure signals each cycle as first through (k/m)-th failure signals.

Here, k and m are natural numbers. For convenience of description, assuming that k is 8, m is 2, and the memory 110 comprises 16-bit data output pins, the embodiment shown in FIG. 1 will now be described. However, it is obvious that k and m of the present invention are not limited to 8 and 2, respectively.

The BIST unit 120 generates 8 preliminary failure signals (not shown) having failure information indicating whether test data (TDATA) corresponds with expected data (not shown), and outputs the 8 preliminary failure signals (not shown) for 2 cycles of the clock signal (BCLK), by outputting 4 preliminary failure signals each cycle as first through fourth failure signals (ERRORB1, ERRORB2, ERRORB3, ERRORB4). DONE indicates whether the BIST test is complete. DIAG is a diagnostic signal that indicates whether errors are included in the test logics of the BIST 120. PAUSE is a control signal that allows for performance of operations such as a retention test.

Figure 2:
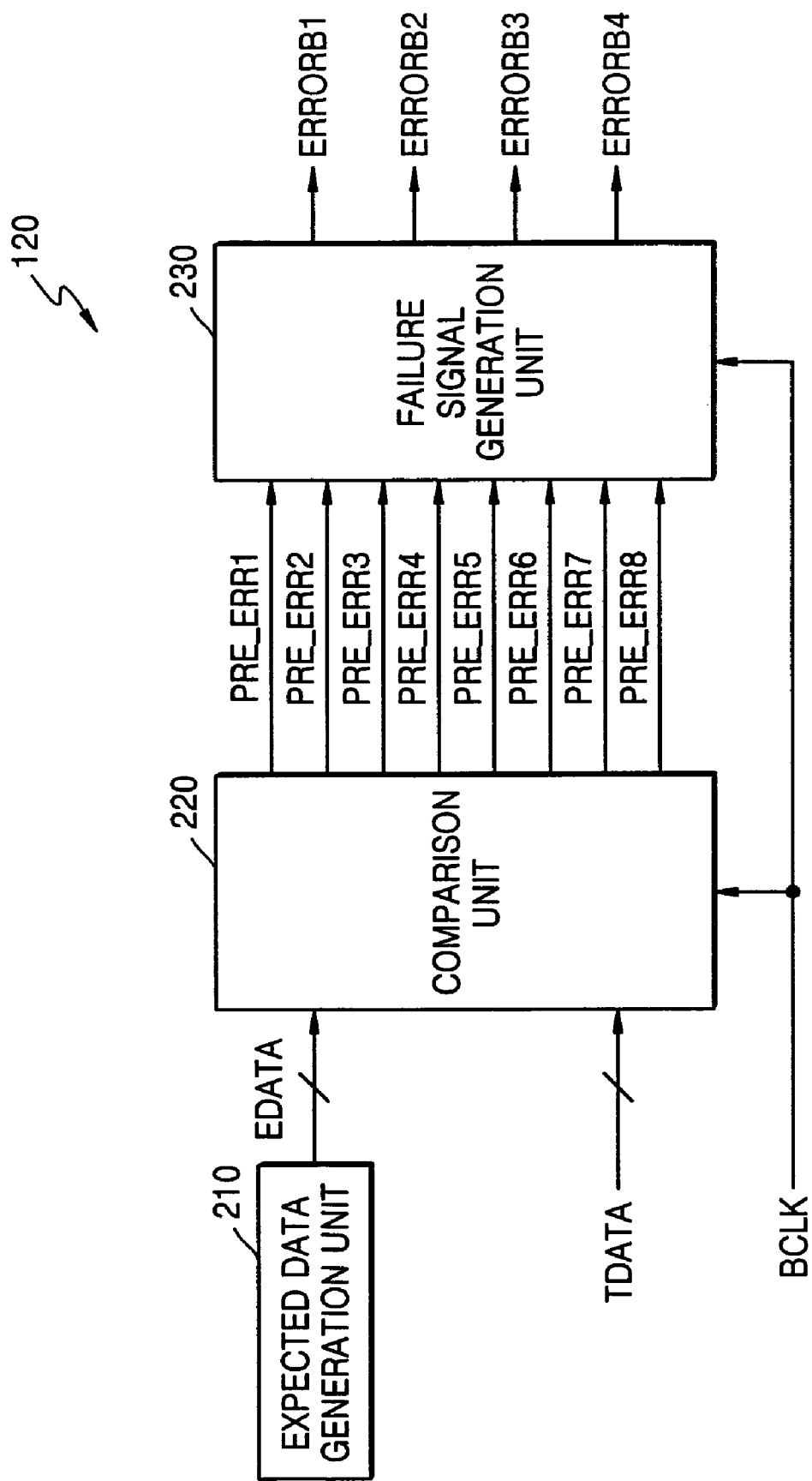
FIG. 2 is a schematic diagram illustrating the structure of a built-in self test (BIST) unit of FIG. 1.

FIG. 2 is a diagram illustrating the structure of the BIST unit of FIG. 1.

Referring to FIG. 2, the BIST unit 120 comprises an expected data generation unit 210, a comparison unit 220 and a failure signal generation unit 230.

The expected data generation unit 210 generates expected data (EDATA). Expected data (EDATA) is compared with test data (TDATA) output from the memory 110 to determine whether there is a failure memory cell in the memory 110. Expected data (EDATA) is the same as test data (TDATA) provided to the memory 110.

The comparison unit 220 receives first through k-th test data that are obtained by dividing n-bit test data (TDATA) from the least significant bit to the most significant bit, which are output from the memory 110 into k groups, into k groups, receives expected data (EDATA), and generates first through k-th preliminary failure signals having failure information.

That is, the comparison unit 220 receives first through eighth data (not shown) that are obtained by dividing 16-bit test data (TDATA) from the least significant bit to the most significant bit, which are output from the memory 110, into 8 groups, receives expected data (EDATA), and generates first through eighth preliminary failure signals (PRE_ERR1, PRE_ERR2, PRE_ERR3, PRE_ERR4, PRE_ERR5, PRE_ERR6, PRE_ERR7, PRE_ERR8) having failure information indicating whether test data (TDATA) correspond to expected data (EDATA).

Figure 3:
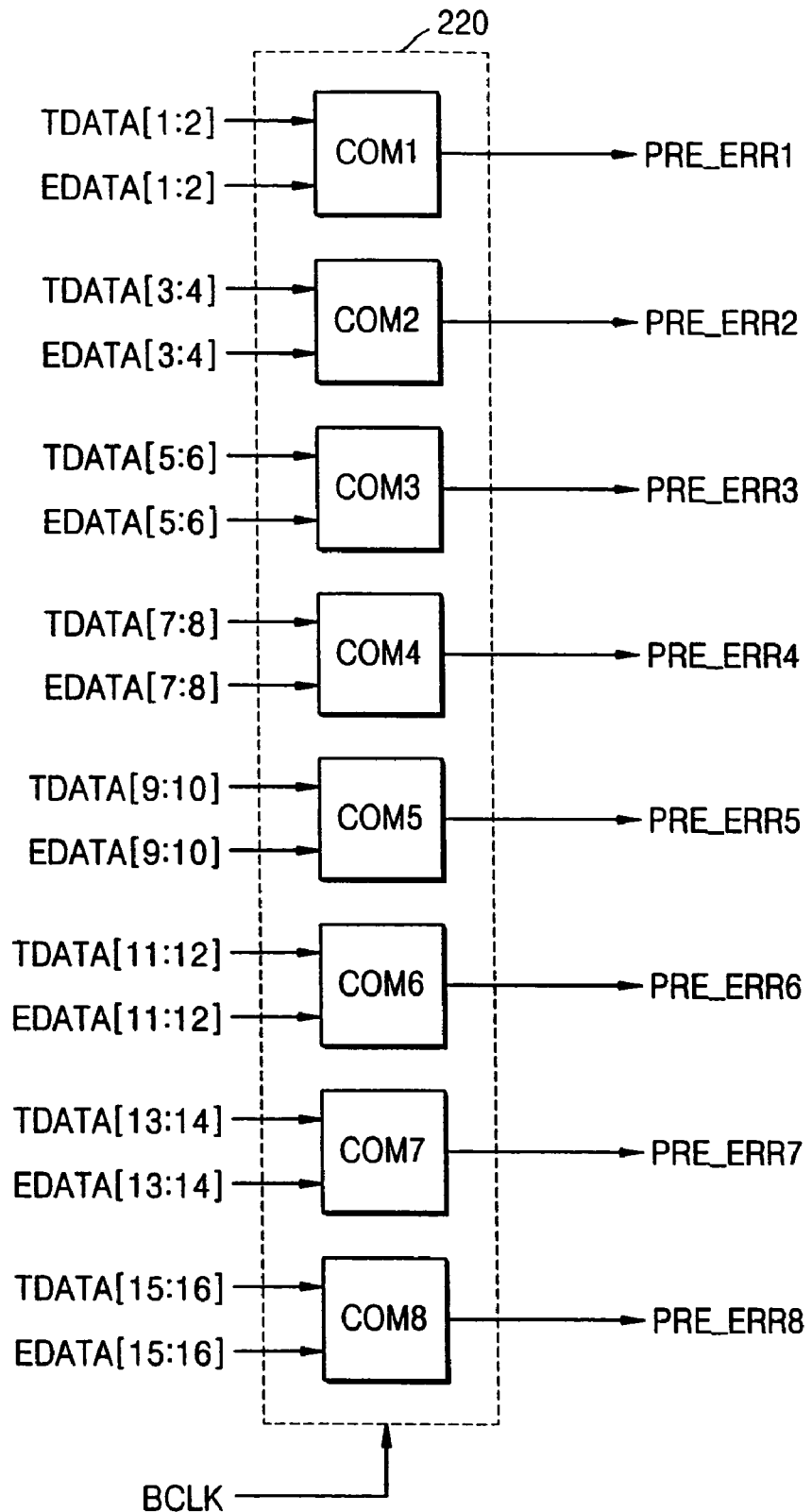
FIG. 3 is a schematic diagram illustrating the structure of a comparison unit of FIG. 2.

FIG. 3 is a diagram illustrating the structure of the comparison unit 220 of FIG. 2.

Is this exemplary case, test data (TDATA) output from the memory 110 is 16 bits long. Since the data output pins (not shown) of the memory 110 are divided into 8 groups, the comparison unit 220 receives first through eighth data (TDATA[1:2], TDATA[3:4], TDATA[5:6], TDATA[7:8], TDATA[9:10], TDATA[11:12], TDATA[13:14], TDATA[15:16]), obtained by dividing the 16-bit test data (TDATA).

If the data output pins of the memory 110 are 32 bits, the memory 110 divides 32-bit data output pins into 8 groups. The test data is divided into 8 groups with each group output from 4-bit data output pins.

That is, first through eighth test data would be expressed as TDATA[1:4], TDATA[5:8], TDATA[9:12], TDATA[13:16], TDATA[17:20], TDATA[21:24], TDATA[25:28], TDATA[29:32], respectively.

The first test data (TDATA[1:2]) of FIG. 3 is output from the data output pins of the first group (not shown) among the data output pins divided into 8 groups of the memory 110.

Accordingly, if there is a failure in the first test data (TDATA[1:2]), it means that there is a failure cell in the memory area (for convenience of description, assuming that this is a first memory area) corresponding to the data output pins (not shown) of the first group among the data output pins divided into 8 groups of the memory 110.

The second test data (TDATA[3:4]) is output from the data output pins of the second group (not shown) among the data output pins divided into 8 groups of the memory 110.

If there is a failure in the second test data (TDATA[3:4]), it means that there is a failure cell in the memory area (for convenience of description, assuming that this is a second memory area) corresponding to the data output pins (not shown) of the second group among the data output pins divided into 8 groups of the memory 110.

This principle is identically applied to the third test data (TDATA[5:6]) through eighth test data (TDATA[15:16]).

The comparison unit 220 comprises first through eighth comparators (COM1, COM2, COM3, COM4, COM5, COM6, COM7, COM8) which compare the first through eighth test data (TDATA[1:2], TDATA[3:4], TDATA[5:6], TDATA[7:8], TDATA[9:10], TDATA[11:12], TDATA[13:14], TDATA[15:16]) with corresponding expected data (EDATA[1:2], EDATA[3:4], EDATA[5:6], EDATA[7:8], EDATA[9:10], EDATA[11:12], EDATA[13:14], EDATA[15:16]) and output first through eighth preliminary failure signals (PRE_ERR1, PRE_ERR2, PRE_ERR3, PRE_ERR4, PRE_ERR5, PRE_ERR6, PRE_ERR7, PRE_ERR8).

The first comparator (COM1) of the comparison unit 220 in response to the clock signal (BCLK) compares the first test data (TDATA[1:2]) and expected data (EDATA[1:2]) and outputs the first preliminary failure signal (PRE_ERR1).

If the first test data (TDATA[1:2]) and expected data (EDATA[1:2]) are identical, the first preliminary failure signal (PRE_ERR1) is output in a "high" logic level, otherwise it is output in a "low" logic level.

That the first test data (TDATA[1:2]) and expected data (EDATA[1:2]) are not identical means that there is a failure in the area of the memory 110 corresponding to the first test data (TDATA[1:2]). Accordingly, if the first preliminary signal (PRE_ERR1) is in a "low" logic level, it means that there is a failure cell in the first area.

In the same manner, according to the logic levels of the first through eighth preliminary failure signals (PRE_ERR1, PRE_ERR2, PRE_ERR3, PRE_ERR4, PRE_ERR5, PRE_ERR6, PRE_ERR7, PRE_ERR8), it can be found where there is a failure cell in the 8 areas of the memory 110.

The failure signal generation unit 230 outputs the first through eighth preliminary failure signals (PRE_ERR1, PRE_ERR2, PRE_ERR3, PRE_ERR4, PRE_ERR5, PRE_ERR6, PRE_ERR7, PRE_ERR8) for two cycles of the clock signals (BCLK), four signals for each cycle as the first through fourth failure signals (ERRORB1, ERRORB2, ERRORB3, ERROR4).

That is, the failure signal generation unit 230 outputs the first through fourth preliminary failure signals (PRE_ERR1, PRE_ERR2, PRE_ERR3, PRE_ERR4) during the first cycle as the first through fourth failure signals (ERRORB1, ERRORB2, ERRORB3, ERROR4).

Then, during the second cycle, the failure signal generation unit 230 outputs the fifth through eighth preliminary failure signals (PRE_ERR5, PRE_ERR6, PRE_ERR7, PRE_ERR8) as the first through fourth failure signals (ERRORB1, ERRORB2, ERRORB3, ERROR4).

By determining the logic levels of the first through fourth failure signals (ERRORB1, ERRORB2, ERRORB3, ERROR4) output for two cycles of the clock signal (BCLK), an area of the memory 110 where a failure cell occurs can be determined. An area of the memory 110 where a failure cell occurs can also be determined by using the first through eighth preliminary failure signals (PRE_ERR1, PRE_ERR2, PRE_ERR3, PRE_ERR4, PRE_ERR5, PRE_ERR6, PRE_ERR7, PRE_ERR8).

In order to use the first through eighth preliminary failure signals (PRE_ERR1, PRE_ERR2, PRE_ERR3, PRE_ERR4, PRE_ERR5, PRE_ERR6, PRE_ERR7, PRE_ERR8), the number of pins of a failure analysis circuit (not shown) to receive the first through eighth preliminary failure signals (PRE_ERR1, PRE_ERR2, PRE_ERR3, PRE_ERR4, PRE_ERR5, PRE_ERR6, PRE_ERR7, PRE_ERR8) and determine an area where a failure cell occurs should be 8.

Four pins are enough for the failure analysis circuit (not shown) to receive the first through fourth failure signals (ERRORB1, ERRORB2, ERRORB3, ERROR4) output from the BIST unit 120 and determine an area where a failure cell occurs.

Accordingly, by dividing the first through eighth preliminary failure signals (PRE_ERR1, PRE_ERR2, PRE_ERR3, PRE_ERR4, PRE_ERR5, PRE_ERR6, PRE_ERR7, PRE_ERR8) into two cycles of the clock signal (BCLK) and outputting the first through fourth failure signals (ERRORB1, ERRORB2, ERRORB3, ERROR4), the number of pins of the failure analysis circuit (not shown) can be reduced.

Figure 4:
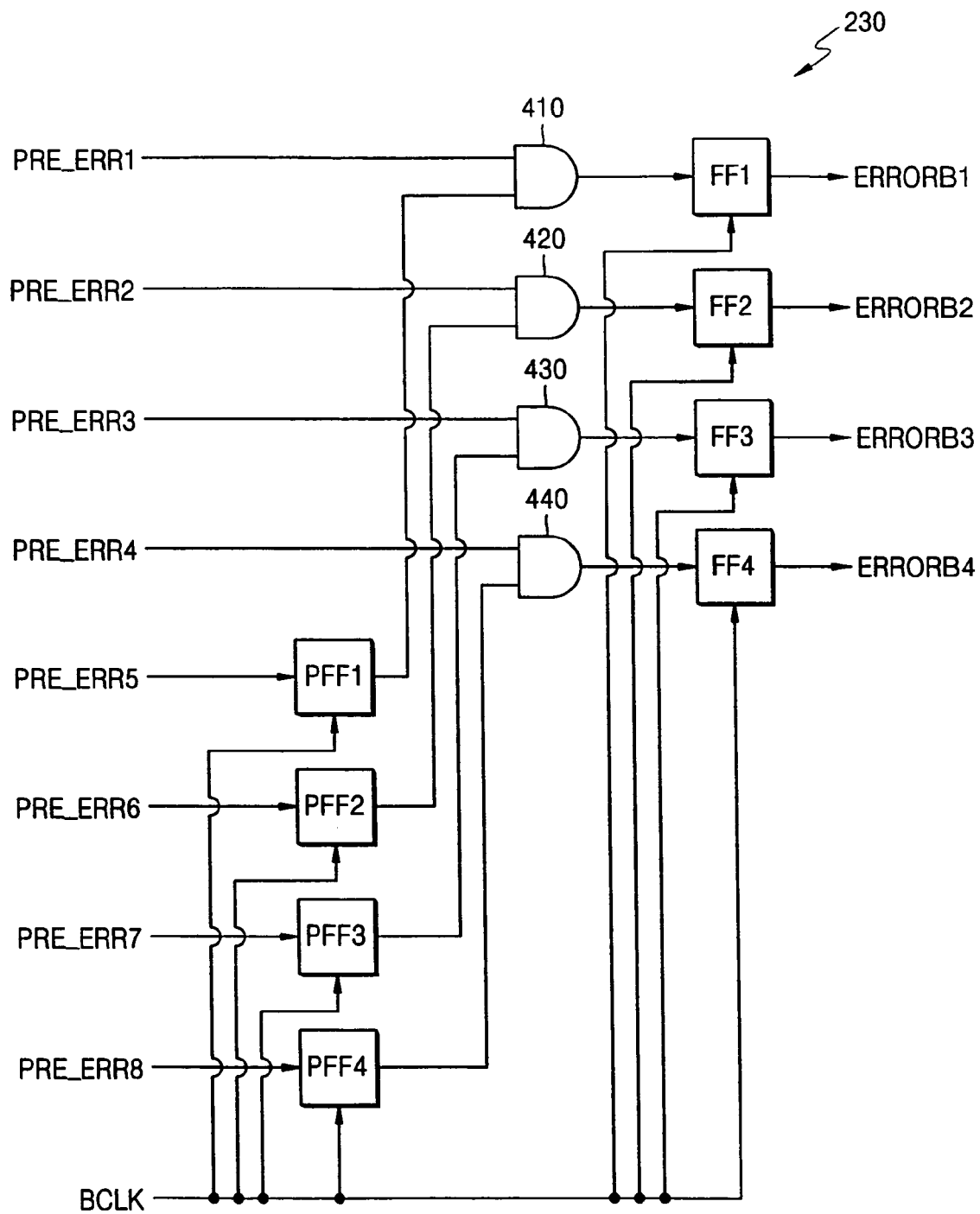
FIG. 4 is a schematic diagram illustrating the structure of a failure signal generation unit of FIG. 2.

FIG. 4 is a diagram illustrating the structure of the failure signal generation unit 230 of FIG. 2.

Referring to FIG. 4, the failure signal generation unit 230 comprises first through fourth preliminary flip-flops (PFF1, PFF2, PFF3, PFF4), first through fourth AND units 410 through 440, and first through fourth flip-flops (FF1, FF2, FF3, FF4).

The first through fourth preliminary flip-flops (PFF1, PFF2, PFF3, PFF4) store the fifth through eighth preliminary failure signals (PRE_ERR5, PRE_ERR6, PRE_ERR7, PRE_ERR8), respectively, synchronized with the clock signal (BCLK). The first through fourth AND units 410 through 440 perform AND operations for the first through fourth preliminary failure signals (PRE_ERR1, PRE_ERR2, PRE_ERR3, PRE_ERR4) with the corresponding output of the first through fourth preliminary flip-flops (PFF1, PFF2, PFF3, PFF4), respectively.

In response to the clock signal (BCLK), the first through fourth flip-flops (FF1, FF2, FF3, FF4) store the outputs of the first through fourth AND units 410 through 440, respectively, and then output as the first through fourth failure signals (ERRORB1, ERRORB2, ERRORB3, ERRORB4).

FIG. 4 illustrates the structure of the failure signal generation unit 230 for dividing the first through eighth preliminary failure signals (PRE_ERR1, PRE_ERR2, PRE_ERR3, PRE_ERR4, PRE_ERR5, PRE_ERR6, PRE_ERR7, PRE_ERR8) for two cycles of the clock signal (BCLK) and outputting as the first through fourth failure signals (ERRORB1, ERRORB2, ERRORB3, ERRORB4).

During the first cycle of the clock signal (BCLK), the fifth through eighth preliminary failure signals (PRE_ERR5, PRE_ERR6, PRE_ERR7, PRE_ERR8) are stored in the first through fourth preliminary flip-flops (PFF1, PFF2, PFF3, PFF4), respectively, and the first through fourth preliminary failure signals (PRE_ERR1, PRE_ERR2, PRE_ERR3, PRE_ERR4) are provided to the first through fourth AND units 410 through 440, respectively.

In the first through fourth preliminary flip-flops (PFF1, PFF2, PFF3, PFF4), data all in a "high" logic level are stored before the fifth through eighth preliminary failure signals (PRE_ERR5, PRE_ERR6, PRE_ERR7, PRE_ERR8) are stored.

Accordingly, the first through fourth AND units 410 through 440 perform AND operations for data in a "high" logic level and the first through fourth preliminary failure signals (PRE_ERR1, PRE_ERR2, PRE_ERR3, PRE_ERR4), respectively, and the results are stored in the first through fourth flip-flops (FF1, FF2, FF3, FF4).

For example, if the first preliminary failure signal (PRE_ERR1) among the first through fourth preliminary failure signals (PRE_ERR1, PRE_ERR2, PRE_ERR3, PRE_ERR4) is in a "low" logic level, the output of the first AND unit 410 among the first through fourth AND units 410 through 440 is in a "low" logic level and the outputs of the second through fourth AND units 420 through 440 are in a "high" logic level.

That is, only the first failure signal (ERRORB1) is output in a "low" logic level and the second through fourth failure signals (ERRORB2, ERRORB3, ERRORB4) are output in a "high" logic level. Since the first failure signal (ERROB1) is output in a "low" logic level during the first cycle of the clock signal (BCLK), it can be found that there is a failure cell in the first area of the eight areas of the memory 110.

During the second cycle of the clock signal (BCLK), the fifth through eighth preliminary failure signals (PRE_ERR5, PRE_ERR6, PRE_ERR7, PRE_ERR8) stored in the first through fourth preliminary flip-flops (PFF1, PFF2, PFF3, PFF4) are provided to the first through fourth AND units 410 through 440. At this time, the first through fourth preliminary failure signals (PRE_ERR1, PRE_ERR2, PRE_ERR3, PRE_ERR4) are in a "high" logic level and are provided to the first through fourth AND units 410 through 440.

That is, irrespective of the logic levels of the first through fourth preliminary failure signals (PRE_ERR1, PRE_ERR2, PRE_ERR3, PRE_ERR4) during the first cycle of the clock signal (BCLK), the logic levels of the first through fourth preliminary failure signals (PRE_ERR1, PRE_ERR2, PRE_ERR3, PRE_ERR4) are transited to a "high" logic level during the second cycle.

The first through fourth AND units 410 through 440 perform AND operations for the first through fourth preliminary failure signals (PRE_ERR1, PRE_ERR2, PRE_ERR3, PRE_ERR4) in a "high" logic level with the fifth through eighth preliminary failure signals (PRE_ERR5, PRE_ERR6, PRE_ERR7, PRE_ERR8) and the results are stored in the first through fourth flip-flops (FF1, FF2, FF3, FF4).

For example, if the fifth preliminary failure signal (PRE_ERR5) among the fifth through eighth preliminary failure signals (PRE_ERR5, PRE_ERR6, PRE_ERR7, PRE_ERR8) is in a "low" logic level, the output of the first AND unit 410 among the first through fourth AND units 410 through 440 is in a "low" logic level and the outputs of the second through fourth AND units 420 through 440 are in a "high" logic level.

That is, only the first failure signal (ERRORB1) is output in a "low" logic level and the second through fourth failure signals (ERRORB2, ERRORB3, ERRORB4) are output in a "high" logic level. Since the first failure signal (ERRORB1) is output in a "low" logic level during the second cycle of the clock signal (BCLK), it can be found that there is a failure cell in the fifth area among the 8 areas of the memory 110.

If there are n memory cells in 8 areas of the memory 110, testing is performed in order from the first memory cell to the n-th memory cell synchronized with the clock signal (BCLK). Accordingly, if the number of clocks of the clock signal (BCLK) is counted from the time when the BIST unit 120 begins to operate, the accurate address of a failure cell is determined.

That is, an area where there is a failure cell in the memory 110 can be found from the first through fourth failure signals (ERRORB1, ERRORB2, ERRORB3, ERRORB4), and by counting the number of clocks of the clock signal (BCLK), the accurate address of the failure cell can be found.

Figure 5:
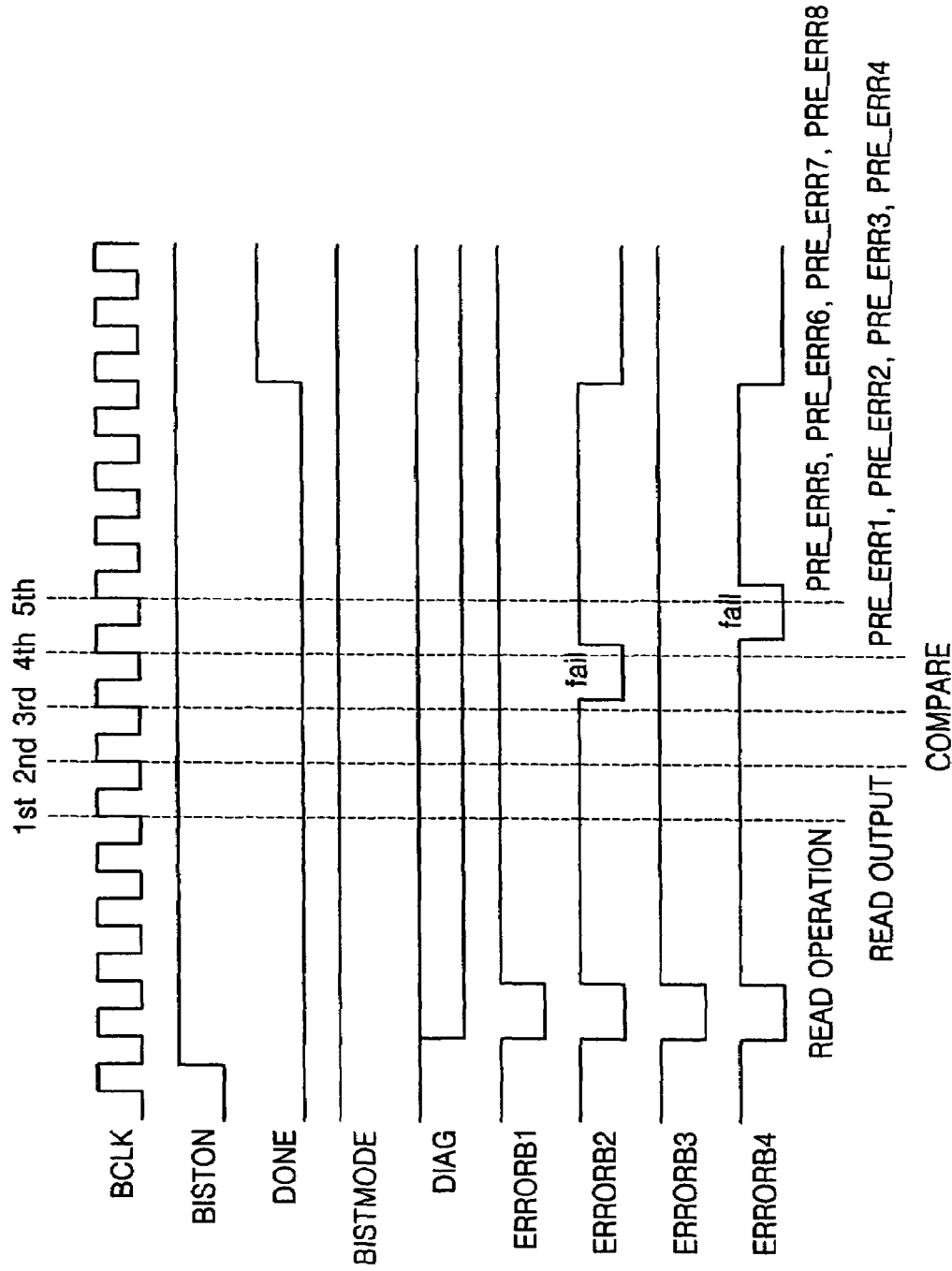
FIG. 5 is a timing diagram illustrating the operation of the memory test circuit of FIG. 1.

FIG. 5 is a timing diagram illustrating the operation of the memory test circuit of FIG. 1. The DONE signal indicates whether the BIST test is complete. The DIAG signal is a diagnostic signal that indicates whether errors are included in the test logics of the BIST 120.

Referring to FIG. 5, from a time when a read operation begins, the number of clocks of the clock signal (BCLK) are divided as 1st, 2nd, 3rd, 4th, and 5th clocks. The $1^{st}$, $2^{nd}$, $3^{rd}$, $4^{th}$ and $5^{th}$ clocks correspond to a read operation, a readout operation, a compare operation, an operation involving the first through fourth preliminary failure signals (PRE_ERR1, PRE_ERR2, PRE_ERR3, PRE_ERR4) and an operation involving the fifth through eighth preliminary failure signals (PRE_ERR5, PRE_ERR6, PRE_ERR7, PRE_ERR8). The output operation of the first through fourth failure signals (ERRORB1, ERRORB2, ERRORB3, ERRORB4) is described in accordance with the following.

If the BIST mode signal (BISTMODE) is in a "high" logic level and the BIST-on signal (BISTON) is in a "high" logic level, the operation of the BIST unit 120 begins.

It is assumed that a read operation for reading test data (TDATA) stored in an arbitrary memory cell address is performed during the first cycle (1st) of the clock signal (BCLK). During the second cycle (2nd) of the clock signal (BCLK), the read test data (TDATA) is output.

Then, during the third cycle (3rd) of the clock signal (BCLK), a comparison operation comparing test data (TDATA) with expected data (EDATA) is performed. During the fourth cycle (4th) of the clock signal (BCLK), the first through fourth failure signals (ERRORB1, ERRORB2, ERRORB3, ERRORB4) are output. At this time, the first through fourth preliminary failure signals (PRE_ERR1, PRE_ERR2, PRE_ERR3, PRE_ERR4) are output as the first through fourth failure signals (ERRORB1, ERRORB2, ERRORB3, ERRORB4), respectively.

Referring to FIG. 5, the second failure signal (ERRORB2) is generated in a "low" logic level. This means that the second preliminary failure signal (PRE_ERR2) is in a "low" logic level and, that is, that there is a failure cell in the second area (not shown) of the memory 110.

During the fifth cycle (5th) of the clock signal (BCLK), the first through fourth failure signals (ERRORB1, ERRORB2, ERRORB3, ERRORB4) are output. At this time, the fifth through eighth preliminary failure signals (PRE_ERR5, PRE_ERR6, PRE_ERR7, PRE_ERR8) are output as the first through fourth failure signals (ERRORB1, ERRORB2, ERRORB3, ERRORB4), respectively.

Referring to FIG. 5, the fourth failure signal (ERRORB4) is generated in a "low" logic level. This means that the eighth preliminary failure signal (PRE_ERR8) is in a "low" logic level and, that is, that there is a failure cell in the eighth area (not shown) of the memory 110.

Thus, by using the first through fourth failure signals (ERRORB1, ERRORB2, ERRORB3, ERRORB4), an area where there is a failure cell in the memory 110 is determined, and by counting the number of clocks of the clock signal (BCLK) from the time when the BIST unit 120 begins to operate, the accurate address of the failure cell is determined.

In the memory test circuit 100 according to an embodiment of the present invention, in order to reduce the number of pins of the failure analysis circuit (not shown) which receives and analyzes the first through fourth failure signals (ERRORB1, ERRORB2, ERRORB3, ERRORB4), the first through eighth preliminary failure signals (PRE_ERR1, PRE_ERR2, PRE_ERR3, PRE_ERR4, PRE_ERR5, PRE_ERR6, PRE_ERR7, PRE_ERR8) are output for two cycles of the clock signal (BCLK) such that four signals are output in each cycle.

In order to further reduce the number of pins of the failure analysis circuit (not shown), the first through eighth preliminary failure signals (PRE_ERR1, PRE_ERR2, PRE_ERR3, PRE_ERR4, PRE_ERR5, PRE_ERR6, PRE_ERR7, PRE_ERR8) may be output for four cycles with two signals output each cycle. Then, the number of pins of the failure analysis circuit (not shown) can be reduced to 2.

Figure 6:
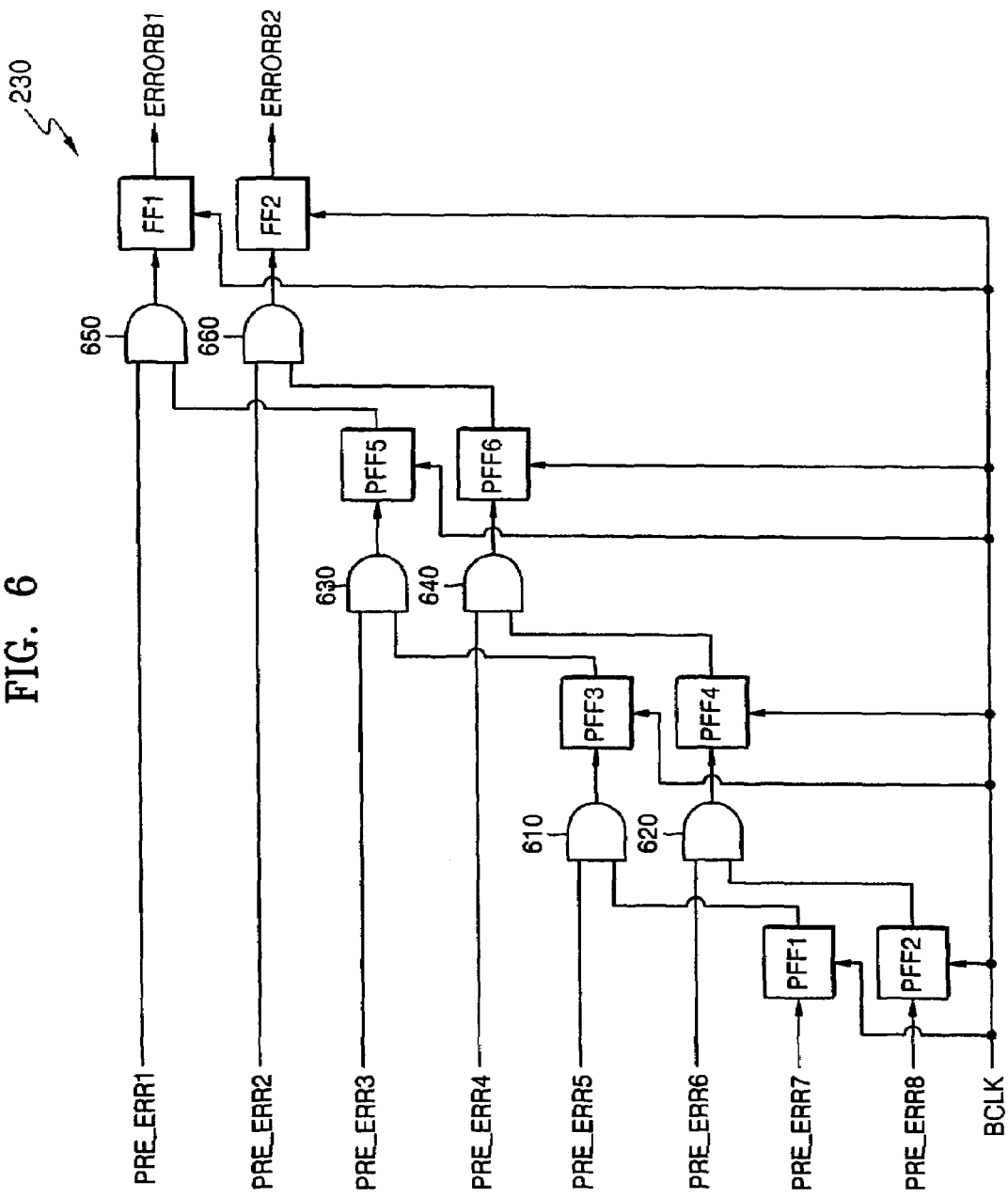
FIG. 6 is a schematic diagram illustrating another preferred embodiment of the failure signal generation unit of FIG. 2.

FIG. 6 is a diagram illustrating another preferred embodiment of the failure signal generation unit of FIG. 2.

The failure signal generation of FIG. 6 shows a case where m is 4.

During the first cycle of the clock signal (BCLK), the failure signal generation unit 230 outputs first and second preliminary failure signals (PRE_ERR1, PRE_ERR2) as first and second failure signals (ERRORB1, ERRORB2), and during the second cycle of the clock signal (BCLK), outputs third and fourth preliminary failure signals (PRE_ERR3, PRE_ERR4) as first and second failure signals (ERRORB1, ERRORB2).

During the third cycle of the clock signal (BCLK), the failure signal generation unit 230 outputs fifth and sixth preliminary failure signals (PRE_ERR5, PRE_ERR6) as first and second failure signals (ERRORB1, ERRORB2), and during the fourth cycle of the clock signal (BCLK), outputs seventh and eighth preliminary failure signals (PRE_ERR7, PRE_ERR8) as first and second failure signals (ERRORB1, ERRORB2).

The failure signal generation unit 230 comprises first and second preliminary flip-flops (PFF1, PFF2), first and second AND units 610 and 620, third and fourth preliminary flip-flops (PFF3, PFF4), third and fourth AND units 630 and 640, fifth and sixth preliminary flip-flops (PFF5, PFF6), fifth and sixth AND units 650 and 660, and first and second flip-flops (FF1, FF2).

The first and second preliminary flip-flops (PFF1, PFF2) store seventh and eighth preliminary failure signals (PRE_ERR7, PRE_ERR8), respectively, synchronized with the clock signal (BCLK). The first and second AND units 610 and 620 perform AND operations for the fifth and sixth preliminary failure signals (PRE_ERR5, PRE_ERR6) with the corresponding first and second preliminary flip-flops (PFF1, PFF2), respectively, and output the results.

The third and fourth preliminary flip-flops (PFF3, PFF4) in response to the clock signal (BCLK) store the outputs of the first and second AND units 610 and 620, respectively. The third and fourth AND units 630 and 640 perform AND operations for the third and fourth preliminary failure signals (PRE_ERR3, PRE_ERR4) with the corresponding third and fourth preliminary flip-flops (PFF3, PFF4), respectively, and output the results.

The fifth and sixth preliminary flip-flops (PFF5, PFF6) in response to the clock signal (BCLK) store the outputs of the third and fourth AND units 630 and 640, respectively. The fifth and sixth AND units 650 and 660 perform AND operations for the first and second preliminary failure signals (PRE_ERR1, PRE_ERR2) with the corresponding fifth and sixth preliminary flip-flops (PFF5, PFF6), respectively, and output the results.

The first and second flip-flops (FF1, FF2) in response to the clock signal (BCLK) store the outputs of the fifth and sixth AND units 650 and. 660, respectively, and then output as the first and second failure signals (ERRORB1, ERRORB2).

The failure signal generation unit 230 of FIG. 6 divides the first through eighth preliminary failure signals (PRE_ERR1, PRE_ERR2, PRE_ERR3, PRE_ERR4, PRE_ERR5, PRE_ERR6, PRE_ERR7, PRE_ERR8) for 4 cycles and outputs two signals in each cycle. With these exceptions, the operation principle of the failure signal generation unit 230 of FIG. 6 is the same as that of the failure signal generation unit 230 of FIG. 4. Accordingly, detailed explanation of the operation will not be repeated.

Figure 7:
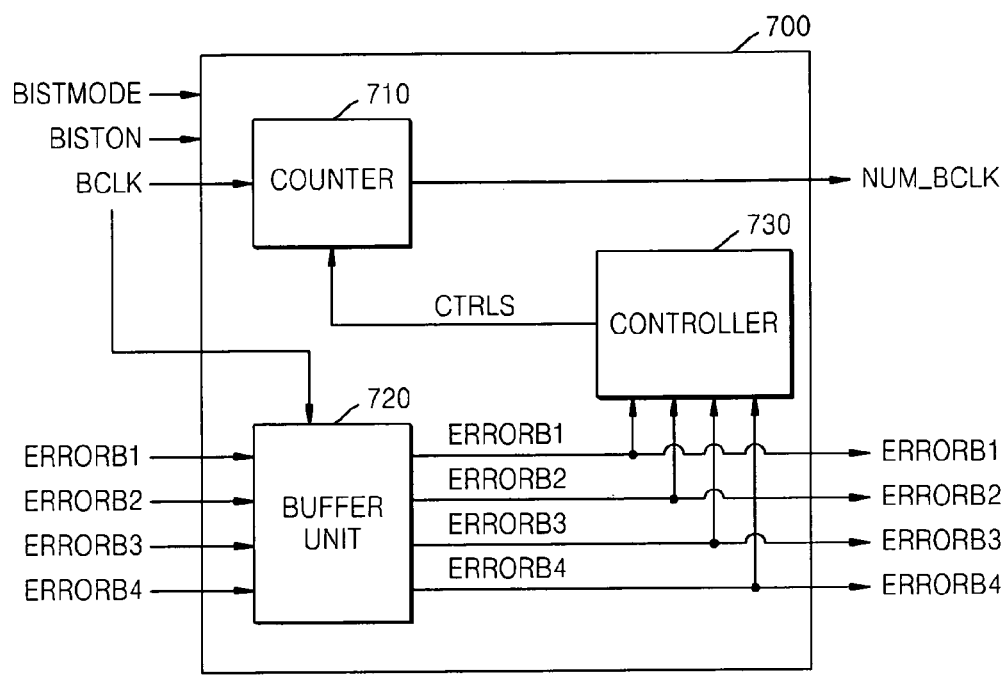
FIG. 7 is a schematic diagram illustrating a failure analysis circuit according to another preferred embodiment of the present invention.

FIG. 7 is a diagram illustrating a failure analysis circuit according to another preferred embodiment of the present invention.

Referring to FIG. 7, the failure analysis circuit 700 comprises a counter 710, a buffer unit 720, and a controller 730.

The counter 710 counts the clock signal (BCLK) and if a control signal (CTRLS) is activated, outputs the number of clocks (NUM_BCLK) of the clock signal (BCLK) counted until that time. The buffer unit 720 receives and stores first through q-th failure signals (ERRORB1, ERRORB2, ERRORB3, ERRORB4) indicating whether there is a failure cell in the memory 110, and outputs the first through q-th failure signals (ERRORB1, ERRORB2, ERRORB3, ERRORB4), synchronized with the clock signal (BCLK).

The controller 730 receives the first through q-th failure signals (ERRORB1, ERRORB2, ERRORB3, ERRORB4) output form the buffer unit 720, and if a failure is recognized, activates the control signal (CTRLS). By using the clock number (NUM_BCLK) output from the counter 710 and the first through q-th failure signals (ERRORB1, ERRORB2, ERRORB3, ERRORB4), the failure analysis circuit 700 analyzes a memory address for which repair is to be performed.

The failure analysis circuit 700 of FIG. 7 is a circuit which receives and analyzes the failure signals (ERRORB1, ERRORB2, ERRORB3, ERRORB4) output from the memory test circuit 100 according to a preferred embodiment of the present invention, and by doing so, analyzes a failure cell address where there is a failure.

For convenience of description, it is assumed that the memory test circuit 100 outputs four failure signals (ERRORB1, ERRORB2, ERRORB3, ERRORB4) and also the failure analysis circuit 700 receives four failure signals (ERRORB1, ERRORB2, ERRORB3, ERRORB4). Accordingly, the first through q-th failure signals (ERRORB1, ERRORB2, ERRORB3, ERRORB4) become first through fourth failure signals (ERRORB1, ERRORB2, ERRORB3, ERRORB4).

If the BIST mode signal (BISTMODE) and BIST-on signal (BISTON) are activated, the counter 710 receives the clock signal (BCLK) and counts the number of clocks of the clock signal (BCLK). The counter 710 begins operation the moment the BIST unit 120 of FIG. 1 operates in response to the clock signal (BCLK).

If the first through fourth failure signals (ERRORB1, ERRORB2, ERRORB3, ERRORB4) are output from the BIST unit 120, the buffer unit 720 stores the first through fourth failure signals (ERRORB1, ERRORB2, ERRORB3, ERRORB4) and then provides them to the controller 730. If a failure in a memory cell is recognized from the first through fourth failure signals (ERRORB1, ERRORB2, ERRORB3, ERRORB4), the controller 730 activates the control signal (CTRLS).

The controller 730 recognizes a failure signal which is in a "low" logic level among the first through fourth failure signals (ERRORB1, ERRORB2, ERRORB3, ERRORB4), and activates the control signal (CTRLS). The counter 710 in response to the activated control signal (CTRLS) outputs the number of clocks (NUM_BCLK) of the clock signal (BCLK) counted until that time.

A designer can determine an area where there is a failure cell in the memory 110 and an accurate address of a failure cell based on the number of clocks (NUM_BCLK) output from the failure analysis circuit 700 and the first through fourth failure signals (ERRORB1, ERRORB2, ERRORB3, ERRORB4).

For example, during the second cycle of the two cycles of the clock signal (BCLK) with each cycle generating the first through fourth failure signals (ERRORB1, ERRORB2, ERRORB3, ERRORB4), if the first failure signal (ERRORB1) is generated in a "low" logic level, it can be determined that there is a failure cell in an area of the memory 110 corresponding to the fifth preliminary failure signal (PRE_ERR5), that is, in the fifth area (not shown).

Since each of the eight areas (not shown) of the memory 110 is tested in order from the first address bit synchronized with the clock signal (BCLK), the address of a failure cell can be found from the number of clocks of the clock signal (BCLK).

The failure analysis circuit 700 of FIG. 7 may be coupled with the memory test circuit 100 of FIG. 1 to form a test system. The operation of this system is the same as one combining the operations of the memory tests circuit 100 and the failure analysis circuit 700 and accordingly, detailed description thereof will not be repeated.

According to the memory test circuit and test system of the present invention as described above, a BIST unit for testing a memory and generating a failure signal is disposed in a memory apparatus and a failure analysis circuit for analyzing a failure signal output by the BIST unit is disposed in the test apparatus. Thus, the burden of designing a memory for test operation can be reduced. In addition, by outputting failure signals after dividing the signals, the overhead of pins of the test apparatus can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory test circuit comprising:
a memory which outputs stored data through n-bit data output pins; and
a built-in self test (BIST) unit which writes n-bit test data in the memory, and by comparing the n-bit test data output from the memory with expected data, determines a failure cell address in the memory,
wherein the BIST unit generates k preliminary failure signals, wherein k is greater than 1 having failure information indicating whether the n-bit test data output from the memory corresponds with the expected data, and outputs the k preliminary failure signals for m cycles of a clock signal, wherein m is greater than 1, by simultaneously outputting k/m preliminary failure signals each cycle as first through k/m failure signals.

2. The memory test circuit of claim 1, wherein when a test operation is performed, the memory divides the n-bit data output pins into eight groups to make the eight groups correspond to respective areas in the memory, and when a repair operation is performed, repair is performed in each area of the memory corresponding to the eight groups of the n-bit data output pins.

3. The memory test circuit of claim 1, wherein the memory is a high capacity single port synchronous random access memory (HCSPSRAM).

4. The memory test circuit of claim 1, wherein the BIST unit comprises:
an expected data generation unit which generates the expected data;
a comparison unit which receives first through k-th test data output that are obtained by dividing the n-bit test data output from the memory, from the least significant bit to the most significant bit, into k groups, and receives the expected data, and then generates first through k-th preliminary failure signals having the failure information; and
a failure signal generation unit which outputs the first through k-th preliminary failure signals for the m cycles of the clock signal by outputting the k/m preliminary failure signals for each cycle as the first through k/m-th failure signals.

5. The memory test circuit of claim 4, wherein the comparison unit comprises:
first through k-th comparators which compare the first through k-th test data with corresponding expected data and outputs the first through k-th preliminary failure signals, respectively.

6. The memory test circuit of claim 4, wherein m is 2 and the failure signal generation unit outputs the first through k/2-th preliminary failure signals as the first through k/2-th failure signals during the first cycle of the clock signal, and during the second cycle of the clock signal, outputs the (k/2+1)-th through k-th preliminary failure signals as the first through k/2-th failure signals.

7. The memory test circuit of claim 6, wherein the failure signal generation unit comprises:
first through fourth preliminary flip-flops which store the (k/2+1)-th through k-th preliminary failure signals, respectively, synchronized with the clock signal;
first through fourth AND units which perform AND operations for the first through k/2-th preliminary failure signals with the outputs of the corresponding first through fourth preliminary flip-flops, respectively; and
first through fourth flip-flops which in response to the clock signal, store the outputs of the first through fourth AND units and then output the stored outputs of the first through fourth AND units as the first through k/2-th failure signals, respectively.

8. The memory test circuit of claim 4, wherein m is 4 and the failure signal generation unit outputs the first through k/4 preliminary failure signals as the first through k/4 failure signals during the first cycle of the clock signal, outputs the (k/4+1)-th through k/2-th preliminary failure signals as the first through k/4 failure signals during the second cycle of the clock signal, outputs the (k/2+1)-th through 3k/4-th preliminary failure signals as the first through k/4 failure signals during the third cycle of the clock signal, and outputs the (3k/4+1)-th through k-th preliminary failure signals as the first through k/4 failure signals during the fourth cycle of the clock signal.

9. The memory test circuit of claim 8, wherein the failure signal generation unit comprises:
first and second preliminary flip-flops which store the (3k/4+1) through k-th preliminary failure signals synchronized with the clock signal;
first and second AND units which perform AND operations for the (k/2+1)-th through 3k/4-th preliminary failure signals with the outputs of the corresponding first and second preliminary flip-flops, respectively, and output the results;
third and fourth preliminary flip-flops which in response to the clock signal store the outputs of the first and second AND units, respectively;
third and fourth AND units which perform AND operations for the (k/4+1)-th through k/2-th preliminary failure signals with the outputs of the corresponding third and fourth preliminary flip-flops, respectively, and output the results;
fifth and sixth preliminary flip-flops which in response to the clock signal store the outputs of the third and fourth AND units, respectively;
fifth and sixth AND units which perform AND operations for the first through k/4-th preliminary failure signals with the outputs of the corresponding fifth and sixth preliminary flip-flops, respectively, and output the results; and
first and second flip-flops which in response to the clock signals store the outputs of the fifth and sixth AND units, respectively, and then output the stored outputs of the fifth and sixth AND units as the first through k/4-th failure signals, respectively.

10. The memory test circuit of claim 1, wherein when n is 16 and k is 8,
the first of k preliminary failure signal indicates information on a failure cell address in a memory area corresponding to first and second data output pins of the memory;
the second of k preliminary failure signal indicates information on a failure cell address in a memory area corresponding to third and fourth data output pins of the memory;
the third of k preliminary failure signal indicates information on a failure cell address in a memory area corresponding to fifth and sixth data output pins of the memory;
the fourth of k preliminary failure signal indicates information on a failure cell address in a memory area corresponding to seventh and eighth data output pins of the memory;
the fifth of k preliminary failure signal indicates information on a failure cell address in a memory area corresponding to ninth and tenth data output pins of the memory;

the sixth of k preliminary failure signal indicates information on a failure cell address in a memory area corresponding to eleventh and twelfth data output pins of the memory;

the seventh of k preliminary failure signal indicates information on a failure cell address in a memory area corresponding to thirteenth and fourteenth data output pins of the memory; and the eighth of k preliminary failure signal indicates information on a failure cell address in a memory area corresponding to fifteenth and sixteenth data output pins of the memory.

11. A failure analysis circuit comprising:

a counter which counts the number of clocks of a clock signal and, when a control signal is activated, outputs the number of clocks of the clock signal counted until that time;

a buffer unit which receives and stores first through q-th failure signals indicating whether or not there is a failure cell in a memory, and outputs the first through q-th failure signals synchronized with the clock signal, wherein q is greater than 1; and a controller which receives the first through q-th failure signals output from the buffer unit and, if a failure is recognized, activates the control signal, wherein the failure analysis circuit analyzes a memory address to be repaired using the number of clocks output from the counter and the first through q-th failure signals.

12. The failure analysis circuit of claim 11, wherein the memory has n-bit data output pins, and when a test operation is performed, divides the n-bit data output pins into eight groups to make the eight groups correspond to respective areas in the memory, and when a repair operation is performed, repair is performed in each area of the memory corresponding to the eight groups of the n-bit data output pins.

13. The failure analysis circuit of claim 12, wherein the memory is a high capacity single port synchronous random access memory (HCSPSRAM).

14. The failure analysis circuit of claim 12, wherein the first through q-th failure signals are q preliminary failure signals of first through eighth preliminary failure signals and are output during every 8/q cycles of the clock signals, and each of the first through eighth preliminary failure signals indicates information on a failure cell address of the corresponding memory area when n-bit data output pins of the memory are divided into 8 groups.

15. A test system comprising:

a memory test circuit which outputs k preliminary failure signals, wherein k is greater than 1, having failure cell address information of a memory, by simultaneously outputting k/m preliminary failure signals as first through k/m-th failure signals for m cycles of a clock signal, wherein m is greater than 1; and a failure analysis circuit which, using the first through k/m-th failure signals and the number of clocks of the clock signals, analyzes a memory address to be repaired.

16. The test system of claim 15, wherein the memory test circuit comprises:

the memory which outputs stored data through n-bit data output pins; and a BIST unit which writes n-bit test data in the memory, and by comparing the n-bit test data output from the memory with expected data, determines a failure cell address in the memory, wherein the BIST unit generates k preliminary failure signals having failure information indicating whether the n-bit test data output from the memory corresponds with the expected data, and outputs the k preliminary failure signals for the m cycles of the clock signal, by outputting the k/m preliminary failure signals each cycle as the first through k/m failure signals.

17. The test system of claim 16, wherein when a test operation is performed, the memory divides the n-bit data output pins into eight groups to make the eight groups correspond to respective areas in the memory, and when a repair operation is performed, repair is performed in each area of the memory corresponding to the eight groups of the n-bit data output pins.

18. The test system of claim 16, wherein the memory is a high capacity single port synchronous random access memory (HCSPSRAM).

19. The test system of claim 16, wherein the BIST unit comprises:

an expected data generation unit which generates the expected data;

a comparison unit which receives first through k-th test data output that are obtained by dividing the n-bit test data output from the memory, from the least significant bit to the most significant bit, into k groups, and receives the expected data, and then generates first through k-th preliminary failure signals having the failure information; and a failure signal generation unit which outputs the first through k-th preliminary failure signals for the m cycles of the clock signal by outputting the k/m preliminary failure signals for each cycle as the first through k/m-th failure signals.

20. The test system of claim 19, wherein the comparison unit comprises:

first through k-th comparators which compare the first through k-th test data with the expected data and outputs the first through k-th preliminary failure signals, respectively.

21. The test system of claim 19, wherein m is 2 and the failure signal generation unit outputs the first through k/2-th preliminary failure signals as the first through k/2-th failure signals during the first cycle of the clock signal, and during the second cycle of the clock signal, outputs the (k/2+1)-th through k-th preliminary failure signals as the first through k/2-th failure signals.

22. The test system of claim 21, wherein the failure signal generation unit comprises:

first through fourth preliminary flip-flops which store the (k/2+1)-th through k-th preliminary failure signals, respectively, synchronized with the clock signal;

first through fourth AND units which perform AND operations for the first through k/2-th preliminary failure signals with the outputs of the corresponding first through fourth preliminary flip-flops, respectively; and first through fourth flip-flops which in response to the clock signal, store the outputs of the first through fourth AND units and then output the stored outputs of the first through fourth AND units as the first through k/2-th failure signals, respectively.

23. The test system of claim 19, wherein m is 4 and the failure signal generation unit outputs the first through k/4 preliminary failure signals as the first through k/4 failure signals during the first cycle of the clock signal, outputs the (k/4+1)-th through k/2-th preliminary failure signals as the first through k/4 failure signals during the second cycle of the clock signal, outputs the (k/2+1)-th through 3k/4-th preliminary failure signals as the first through k/4 failure signals during the third cycle of the clock signal, and outputs the (3k/4+1)-th through k-th preliminary failure signals as the first through k/4 failure signals during the fourth cycle of the clock signal.

24. The test system of claim 23, wherein the failure signal generation unit comprises:
first and second preliminary flip-flops which store the (3k/4+1) through k-th preliminary failure signals synchronized with the clock signal;
first and second AND units which perform AND operations for the (k/2+1)-th through 3k/4-th preliminary failure signals with the outputs of the corresponding first and second preliminary flip-flops, respectively, and output the results;
third and fourth preliminary flip-flops which in response to the clock signal store the outputs of the first and second AND units, respectively;
third and fourth AND units which perform AND operations for the (k/4+1)-th through k/2-th preliminary failure signals with the outputs of the corresponding third and fourth preliminary flip-flops, respectively, and output the results;
fifth and sixth preliminary flip-flops which in response to the clock signal store the outputs of the third and fourth AND units, respectively;
fifth and sixth AND units which perform AND operations for the first through k/4-th preliminary failure signals with the outputs of the corresponding fifth and sixth preliminary flip-flops, respectively, and output the results; and
first and second flip-flops which in response to the clock signals store the outputs of the fifth and sixth AND units, respectively, and then output the stored outputs of the fifth and sixth AND units as the first through k/4-th failure signals, respectively.

25. The test system of claim 15, wherein the failure analysis circuit comprises:
a counter which counts the number of clocks of the clock signal and, when a control signal is activated, outputs the number of clocks of the clock signal counted until that time;
a buffer unit which receives and stores first through k/m-th failure signals indicating whether or not there is a failure cell in the memory, and outputs the first through k/m-th failure signals synchronized with the clock signal; and
a controller which receives the first through k/m-th failure signals output from the buffer unit and, if a failure is recognized, activates the control signal, wherein the failure analysis circuit analyzes the memory address to be repaired using the number of clocks output from the counter and the first through k/m-th failure signals.

26. The test system of claim 25, wherein the first through k/m-th failure signals are the k/m preliminary failure signals of first through eighth preliminary failure signals and are output during every m cycles of the clock signals, and each of the first through eighth preliminary failure signals indicates information on the failure cell address of the corresponding memory area when n-bit data output pins of the memory are divided into 8 groups.

* * * * *